US008451672B2

(12) United States Patent
Tachibana (10) Patent No.: US 8,451,672 B2
(45) Date of Patent: May 28, 2013

(54) SEMICONDUCTOR STORAGE DEVICE

(75) Inventor: Fumihiko Tachibana, Koganei (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 138 days.

(21) Appl. No.: 13/050,799

(22) Filed: Mar. 17, 2011

(65) Prior Publication Data

US 2012/0008430 A1 Jan. 12, 2012

(30) Foreign Application Priority Data

Jul. 7, 2010 (JP) ................................. 2010-154608

(51) Int. Cl.
*G11C 7/00* (2006.01)

(52) U.S. Cl.
USPC .............. 365/189.16; 365/185.2; 365/189.04; 365/210.1

(58) Field of Classification Search
USPC .................. 365/189.16, 189.04, 210.1, 185.2
See application file for complete search history.

(56) References Cited

U.S. PATENT DOCUMENTS

| 5,062,079 | A | * | 10/1991 | Tsuchida et al. | ............... | 365/205 |
| 6,009,040 | A | * | 12/1999 | Choi et al. | .................. | 365/210.1 |
| 6,876,576 | B2 | * | 4/2005 | Hidaka, Hideto | ............ | 365/171 |
| 7,606,086 | B2 | * | 10/2009 | Inoue | ........................ | 365/189.15 |
| 7,656,732 | B2 | * | 2/2010 | Kuroda | .......................... | 365/207 |
| 8,125,845 | B2 | * | 2/2012 | Komatsu et al. | ............... | 365/203 |
| 2007/0263447 | A1 | | 11/2007 | Koike et al. | | |

FOREIGN PATENT DOCUMENTS

| JP | H04-069893 | 3/1992 |
| JP | 2006-004463 | 1/2006 |
| JP | 2007-328900 | 12/2007 |

OTHER PUBLICATIONS

Khellah et al., "Wordline and Bitline Pulsing Schemes for Improving SRAM Cell Stability in Low-Vcc 65mm CMOS Designs", VLSI Circuits pp. 9-10, Jun. 2006.
Toshiba, Background Art Information, Nov. 19, 2010.
Prior Art Information List, undated, in 1 page.

* cited by examiner

*Primary Examiner* — Pho M Luu (74) *Attorney, Agent, or Firm* — Knobbe, Martens, Olson & Bear LLP (57) ABSTRACT

A memory cell stores therein data, a dummy cell replicates an operation of the memory cell, a write control unit makes the dummy cell to perform writing in synchronization with write timing of the memory cell, and a row decoder performs opening and closing of a word line that performs a row selection of the memory cell based on a monitored result of a write condition of the dummy cell.

18 Claims, 8 Drawing Sheets

SEMICONDUCTOR STORAGE DEVICE

CROSS-REFERENCE TO RELATED APPLICATIONS

This application is based upon and claims the benefit of priority from the prior Japanese Patent Application No. 2010-154608, filed on Jul. 7, 2010, the entire contents of which are incorporated herein by reference.

FIELD

Embodiments described herein relate generally to a semiconductor storage device.

BACKGROUND

With the reduction in voltage, it has become difficult to ensure stability of an SRAM cell. As an on-time of a word line becomes long, the number of cells that cause a disturb failure in which internal data is inverted at the time of reading is increased. On the other hand, if the on-time is shortened, the number of cells that cause a read failure due to read current shortage or a write failure tends to be large, so that both are in a trade-off relation.

DETAILED DESCRIPTION

In general, according to one embodiment, a memory cell, a dummy cell, a write control unit, and a row decoder are provided. The memory cell stores therein data. The dummy cell replicates an operation of the memory cell. The write control unit makes the dummy cell to perform writing in synchronization with write timing of the memory cell. The row decoder performs opening and closing of a word line that performs a row selection of the memory cell based on a monitored result of a write condition of the dummy cell.

A semiconductor storage device according to the embodiments will be explained below with reference to the drawings. The present invention is not limited to these embodiments.

First Embodiment

Figure 1:
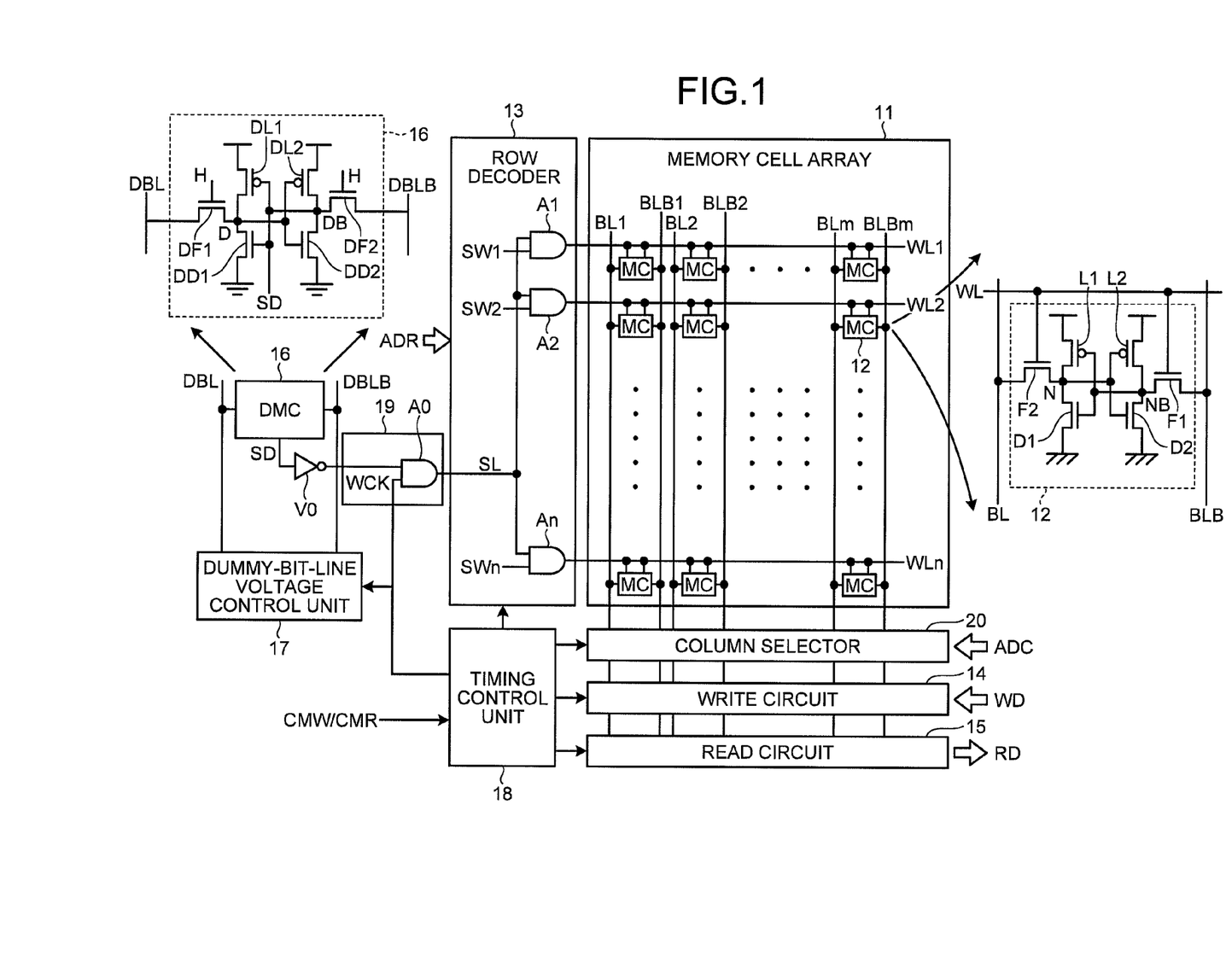
FIG. 1 is a block diagram illustrating a schematic configuration of a semiconductor storage device according to a first embodiment.

FIG. 1 is a block diagram illustrating a schematic configuration of a semiconductor storage device according to the first embodiment.

In FIG. 1, the semiconductor storage device includes a memory cell array 11, a row decoder 13, a write circuit 14, a read circuit 15, a column selector 20, a dummy cell 16, a dummy-bit-line voltage control unit 17, a timing control unit 18, and a selection-time control unit 19.

In the memory cell array 11, memory cells 12 are arranged in a matrix manner in a row direction and a column direction. The memory cells 12 can complementarily store therein data and can, for example, configure an SRAM.

In the memory cell array 11, word lines WL1 to WLn (n is an integer of two or more) that transmit a signal that performs a row selection of the memory cells 12 are provided. Moreover, in the memory cell array 11, bit lines BL1 to BLm and BLB1 to BLBm (m is an integer of two or more) that transmit data exchanged with the memory cells 12 are provided.

The memory cells 12 in the same row are connected in common via each of the word lines WL1 to WLn. Moreover, the memory cells 12 in the same column are connected in common via each of the bit lines BL1 to BLm and BLB1 to BLBm. At the time of reading/writing to the memory cell 12, the bit lines BL1 to BLm and the bit lines BLB1 to BLBm can be complementarily operated with each other. For example, at the time of the reading/writing to the memory cell 12, when the bit lines BL1 to BLm are set at a high level, the bit lines BLB1 to BLBm can be set to a low level, and when the bit lines BL1 to BLm are set at a low level, the bit lines BLB1 to BLBm can be set to a high level. The bit lines BL1 to BLm and the bit lines BLB1 to BLBm are both pre-charged to a high level at the time of standby.

The memory cell 12 includes a pair of drive transistors D1 and D2, a pair of load transistors L1 and L2, and a pair of transfer transistors F1 and F2. As the load transistors L1 and L2, a P-channel field effect transistor can be used, and as the drive transistors D1 and D2 and the transfer transistors F1 and F2, an N-channel field effect transistor can be used.

The drive transistor D1 and the load transistor L1 are connected in series with each other to form a CMOS inverter, and the drive transistor D2 and the load transistor L2 are connected in series with each other to form a CMOS inverter. The inputs and the outputs of a pair of the CMOS inverters are cross-coupled with each other to form a flip-flop. Any word line WL of the word lines WL1 to WLn is connected to the gates of the transfer transistors F1 and F2.

Moreover, any bit line BL of the bit lines BL1 to BLm is connected to the gate of the drive transistor D2, the gate of the load transistor L2, the drain of the drive transistor D1, and the drain of the load transistor L1 via the transfer transistor F2. Moreover, any bit line BLB of the bit lines BLB1 to BLBm is connected to the drain of the drive transistor D2, the drain of the load transistor L2, the gate of the drive transistor D1, and the gate of the load transistor L1 via the transfer transistor F1.

The connection point of the drain of the drive transistor D1 and the drain of the load transistor L1 can form a storage node N and the connection point of the drain of the drive transistor D2 and the drain of the load transistor L2 can form a storage node NB.

The write circuit 14 can access the memory cell 12 via the bit lines BL and BLB and write data WD to the memory cell 12.

The read circuit 15 can access the memory cell 12 via the bit lines BL and BLB and read out read data RD from the memory cell 12. In the read circuit 15, it is possible to provide a sense amplifier that detects data stored in the memory cell 12 based on a signal read out on the bit lines BL and BLB from the memory cell 12.

The dummy cell 16 can replicate the operation of the memory cell 12 and can be configured in the similar manner to the memory cell 12.

The dummy cell 16 includes a pair of drive transistors DD1 and DD2, a pair of load transistors DL1 and DL2, and a pair of transfer transistors DF1 and DF2. As the load transistors DL1 and DL2, a P-channel field effect transistor can be used, and as the drive transistors DD1 and DD2 and the transfer transistors DF1 and DF2, an N-channel field effect transistor can be used.

The drive transistor DD1 and the load transistor DL1 are connected in series with each other to form a CMOS inverter, and the drive transistor DD2 and the load transistor DL2 are connected in series with each other to form a CMOS inverter. The inputs and the outputs of a pair of the CMOS inverters are cross-coupled with each other to form a flip-flop. A high-level potential is applied to the gates of the transfer transistors DF1 and DF2, so that the transfer transistors DF1 and DF2 are maintained in the on-state.

The gate of the drive transistor DD2, the gate of the load transistor DL2, the drain of the drive transistor DD1, and the drain of the load transistor DL1 are connected to a dummy bit line DBL via the transfer transistor DF1. Moreover, the drain of the drive transistor DD2, the drain of the load transistor DL2, the gate of the drive transistor DD1, and the gate of the load transistor DL1 are connected to a dummy bit line DBLB via the transfer transistor DF2.

The connection point of the drain of the drive transistor DD1 and the drain of the load transistor DL1 can form a dummy node D and the connection point of the drain of the drive transistor DD2 and the drain of the load transistor DL2 can form a dummy node DB.

At the time of reading/writing to the dummy cell 16, the dummy bit lines DBL and DBLB can be complementarily operated with each other. For example, at the time of the reading/writing to the dummy cell 16, when the dummy bit line DBL is set at a high level, the dummy bit line DBLB can be set to a low level, and when the dummy bit line DBL is set at a low level, the dummy bit line DBLB can be set to a high level. For the dummy cell 16, it is applicable to raise the voltage on the low side of the dummy bit line DBL higher than the voltage on the low side of the bit line BL so that inversion of data stored in the dummy node DB is delayed by a predetermined value for obtaining a margin at the time of writing to the memory cell 12.

The dummy-bit-line voltage control unit 17 can control the voltage of the dummy bit lines DBL and DBLB so that data stored in the dummy node DB is inverted in each write cycle. In other words, the dummy-bit-line voltage control unit 17 can invert data stored in the dummy cell 16 every time opening/closing of a word line WL is instructed.

Alternatively, the dummy-bit-line voltage control unit 17 can control the voltage of the dummy bit lines DBL and DBLB to return data stored in the dummy node DB to the initial value after inverting the data stored in the dummy node DB in each write cycle.

The selection-time control unit 19 can control a row selection time of the memory cell 12 based on an inversion condition of data stored in the dummy node DB. For example, when the data stored in the dummy node DB is inverted, it is possible to determine that writing to the memory cell 12 is completed and control to close the word line WL.

The selection-time control unit 19 includes an AND circuit A0. The dummy node DB is connected to one input terminal of the AND circuit A0 via an inverter V0 and a word-line open allowing signal WCK that instructs opening/closing of the word lines WL1 to WLn is input to the other input terminal of the AND circuit A0.

The row decoder 13 can perform a row selection of the memory cell 12 specified by a row address ADR based on the row selection time controlled in the selection-time control unit 19. For example, it is possible to open the word line WL until data stored in the dummy node DB is inverted and perform writing to the memory cell 12.

The row decoder 13 includes AND circuits A1 to An for respective rows. The output terminal of the inverter V0 is connected to one input terminals of the AND circuits A1 to An, and word-line selection signals SW1 to SWn are input to the other input terminals of the AND circuits A1 to An, respectively.

The column selector 20 can perform a column selection of the memory cell 12 specified by a column address ADC.

The timing control unit 18 can control write timing and read timing based on a write command CMW or a read command CMR. Moreover, the timing control unit 18 can output the word-line open allowing signal WCK to the dummy-bit-line voltage control unit 17 and the selection-time control unit 19. It is applicable to determine whether to perform writing or reading based on whether a read/write signal is a high level or a low level, and in a single-port SRAM, it is possible to use only one signal for controlling the write timing and the read timing.

Figure 2:
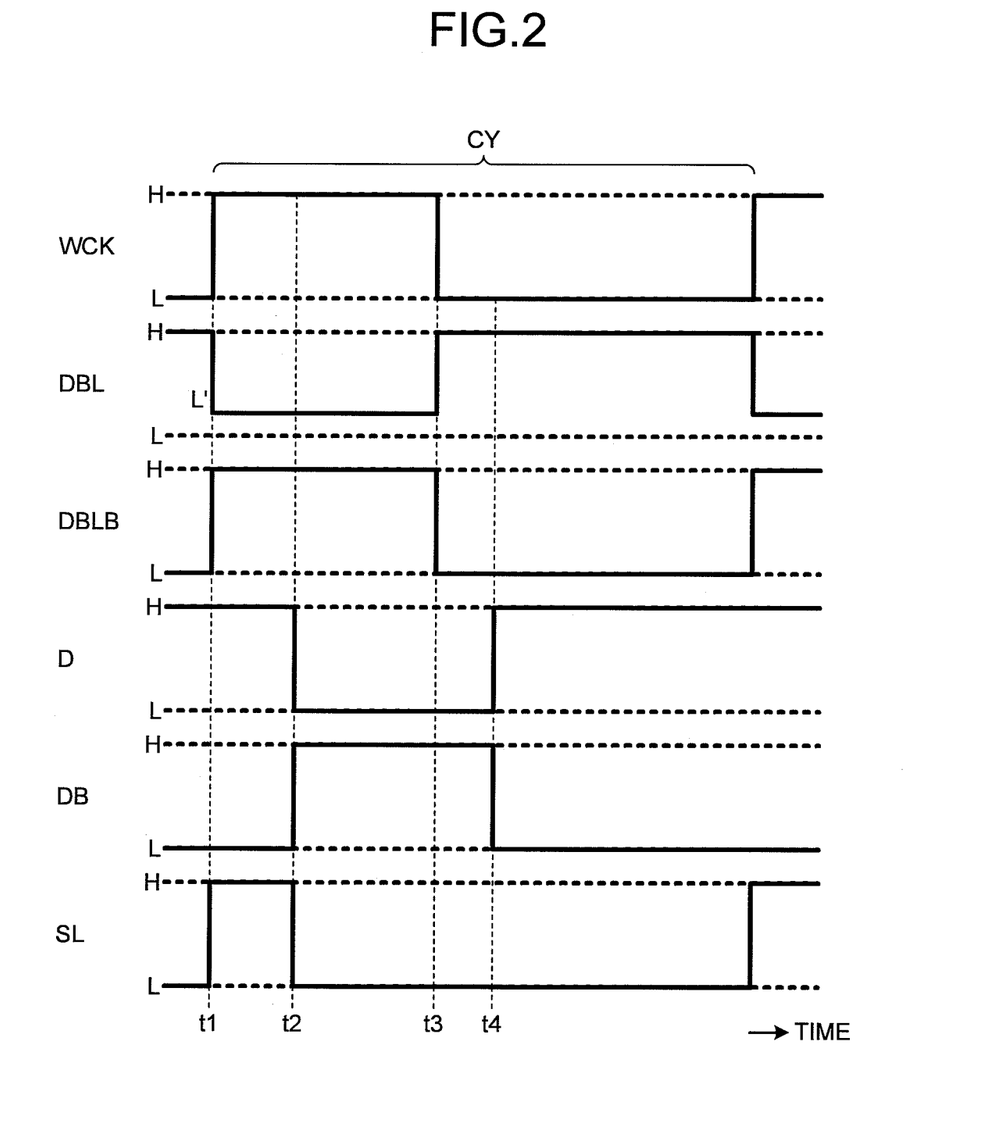
FIG. 2 is a timing chart illustrating a voltage waveform of each unit of the semiconductor storage device in FIG. 1.

FIG. 2 is a timing chart illustrating a voltage waveform of each unit of the semiconductor storage device in FIG. 1.

In FIG. 2, '1' is written in the dummy node D of the dummy cell 16 as an initial value and the dummy node D is maintained at a high level H, and '0' is written in the dummy node DB as an initial value and the dummy node DB is maintained at a low level L.

Moreover, the word-line open allowing signal WCK repeats the high level H and the low level L alternately for each cycle CY. When the word-line open allowing signal WCK is the high level H, opening of the word line WL is allowed, and when the word-line open allowing signal WCK is the low level L, opening of the word line WL is prohibited.

Furthermore, the dummy-bit-line voltage control unit 17 can control the voltage of the dummy bit lines DBL and DBLB in synchronization with the word-line open allowing signal WCK. For example, when the word-line open allowing signal WCK is the high level H, the potential of the dummy bit line DBL can be set to a low level L' and the potential of the dummy bit line DBLB can be set to the high level H. The potential at the low level L' can be set higher than that at the low level L. When the word-line open allowing signal WCK is the low level L, the potential of the dummy bit line DBL can be set to the high level H and the potential of the dummy bit line DBLB can be set to the low level L.

When writing the write data WD to the memory cell 12, the write command CMW is input to the timing control unit 18, the row address ADR is input to the row decoder 13, the column address ADC is input to the column selector 20, and the write data WD is input to the write circuit 14.

Then, the potential of bit lines of the bit lines BL1 to BLm and BLB1 to BLBm specified by the column address ADC is set corresponding to the write data WD.

Moreover, when the row address ADR is input to the row decoder 13, the row address ADR is decoded, so that a word-line selection signal of the word-line selection signals SW1 to SWn that selects a row including a selected cell is set to the high level H.

At this time, the dummy node D is maintained at the high level H and the dummy node DB is maintained at the low level L, so that a node detection signal becomes the low level L, is inverted in the inverter V0 to become the high level H, and is then input to one input terminal of the AND circuit A0.

Then, when the word-line open allowing signal WCK becomes the high level H, the potential of the output terminal of the AND circuit A0 becomes the high level H and a word-line open signal SL becomes the high level H (time t1). When the word-line open signal SL becomes the high level H, the word-line open signal SL is applied to the word line WL of the selected row via the AND circuit of the AND circuits A1 to An in which corresponding one of the word-line selection signals SW1 to SWn is set to the high level H.

Then, when the word line WL of the selected row becomes the high level, the transfer transistors F1 and F2 of the memory cell 12 are turned on and the potentials of the bit lines BL and BLB set corresponding to the write data WD are complementarily applied to the storage nodes N and NB, so that the write data WD is written to the memory cell 12.

Moreover, when the word-line open allowing signal WCK is the high level H, the potential of the dummy bit line DBL is set to the low level L' and the potential of the dummy bit line DBLB is set to the high level H. Therefore, the levels of the dummy nodes D and DB are inverted, and the dummy node D is transitioned to the low level L and the dummy node DB is transitioned to the high level H (time 2).

Then, when the dummy node DB is transitioned to the high level H, the node detection signal SD becomes the high level H, is inverted in the inverter V0 to become the low level L, and is then input to one input terminal of the AND circuit A0.

Therefore, the potential of the output terminal of the AND circuit A0 becomes the low level L and the word-line open signal SL becomes the low level L. When the word-line open signal SL becomes the low level L, the word line WL of the selected row becomes the low level L and the transfer transistors F1 and F2 of the memory cell 12 are turned off, so that writing to the memory cell 12 is stopped.

At the time of writing to the memory cell 12, the word line WL of the selected row is controlled to close at the time when the level of the dummy node DB is inverted, so that the time in which the word line WL is open after completing writing to the memory cell 12 can be shortened, whereby a disturb failure can be reduced while suppressing reduction in write margin.

The dummy cell 16 is configured in the similar manner to the memory cell 12 and is controlled such that writing to the dummy cell 16 is performed synchronizing with the write timing of the memory cell 12, so that when writing to the dummy cell 16 is completed, it is possible to determine that writing to the memory cell 12 is completed.

Moreover, it is possible to control such that inversion of data stored in the dummy node DB does not occur easily by raising the voltage on the low side of the dummy bit line DBL higher than the voltage on the low side of the bit line BL, so that a write time of the dummy cell 16 can have a margin. Therefore, even when the time required for writing to the memory cell 12 and the dummy cell 16 varies, it is possible to prevent the word line WL from closing before completing writing to the memory cell 12.

Next, when the word-line open allowing signal WCK becomes the low level L (time t3), the potential of the dummy bit line DBL is set to the high level H and the potential of the dummy bit line DBLB is set to the low level L. Therefore, the levels of the dummy nodes D and DB are inverted, and the dummy node D is transitioned to the high level H and the dummy node DB is transitioned to the low level L, whereby the levels of the dummy nodes D and DB are returned to the initial value (time t4).

On the other hand, when reading out read data RD from the memory cell 12, the read command CMR is input to the timing control unit 18, the row address ADR is input to the row decoder 13, and the column address ADC is input to the column selector 20.

Then, the row address ADR is decoded in the row decoder 13, so that a word-line selection signal of the word-line selection signals SW1 to SWn that selects a row including a selected cell is set to the high level H.

At this time, the dummy node D is maintained at the high level H and the dummy node DB is maintained at the low level L, so that the node detection signal SD becomes the low level L, is inverted in the inverter V0 to become the high level H, and is then input to one input terminal of the AND circuit A0.

Then, when the word-line open allowing signal WCK becomes the high level H, the potential of the output terminal of the AND circuit A0 becomes the high level H and the word-line open signal SL becomes the high level H (time t1). When the word-line open signal SL becomes the high level H, the word-line open signal SL is applied to the word line WL of the selected row via the AND circuit of the AND circuits A1 to An in which corresponding one of the word-line selection signals SW1 to SWn is set to the high level H.

Then, when the word line WL of the selected row becomes the high level, the transfer transistors F1 and F2 of the memory cell 12 are turned on and the potentials of the bit lines BL and BLB change in accordance with the potentials of the storage nodes N and NB. Then, the potential change of the bit lines BL and BLB is sent to the read circuit 15 via the column selector 20 and it is determined whether the read data RD is '0' or '1'.

Moreover, when the word-line open allowing signal WCK is the high level H, the potential of the dummy bit line DBL is set to the low level L' and the potential of the dummy bit line DBLB is set to the high level H. Therefore, the levels of the dummy nodes D and DB are inverted, and the dummy node D is transitioned to the low level L and the dummy node DB is transitioned to the high level H (time 2).

Then, when the dummy node DB is transitioned to the high level H, the node detection signal SD becomes the high level H, is inverted in the inverter V0 to become the low level L, and is then input to one input terminal of the AND circuit A0.

Therefore, the potential of the output terminal of the AND circuit A0 becomes the low level L and the word-line open signal SL becomes the low level L. When the word-line open signal SL becomes the low level L, the word line WL of the selected row becomes the low level L and the transfer transistors F1 and F2 of the memory cell 12 are turned off, so that reading of the memory cell 12 is stopped.

At the time of reading of the memory cell 12 again, the word line WL of the selected row is controlled to close at the time when the level of the dummy node DB is inverted, so that it is not needed to separately use the row decoder 13 between the time of reading and the time of writing to the memory cell 12, thus enabling to suppress increase in circuit scale.

In the above embodiment, the method is explained in which at the time of reading from the memory cell 12, opening/closing of the word line WL is performed based on the control in the similar manner to the time of writing to the memory cell 12; however, it is applicable to perform opening/closing of the word line WL based on the control different from the time of writing to the memory cell 12 at the time of reading from the memory cell 12.

Figure 3:
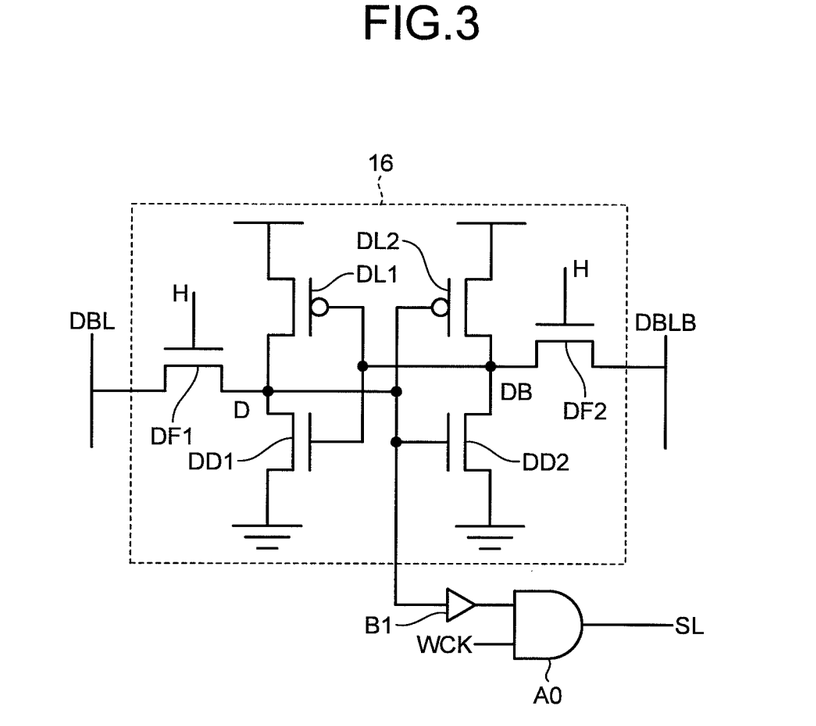
FIG. 3 is a circuit diagram illustrating another example of a dummy cell applied to the semiconductor storage device in FIG. 1.

FIG. 3 is a circuit diagram illustrating another example of the dummy cell applied to the semiconductor storage device in FIG. 1.

In the first embodiment, explanation is given for the method of controlling the row selection time of the memory cell 12 based on an inversion condition of data stored in the dummy node DB; however, as shown in FIG. 3, the row selection time of the memory cell 12 can be controlled based on the inversion condition of data stored in the dummy node D.

In this case, in the first embodiment, the dummy node DB is connected to one input terminal of the AND circuit A0 via the inverter V0; however, in the embodiment in FIG. 3, the dummy node D can be connected to one input terminal of the AND circuit A0 via a buffer B1.

Figure 4:
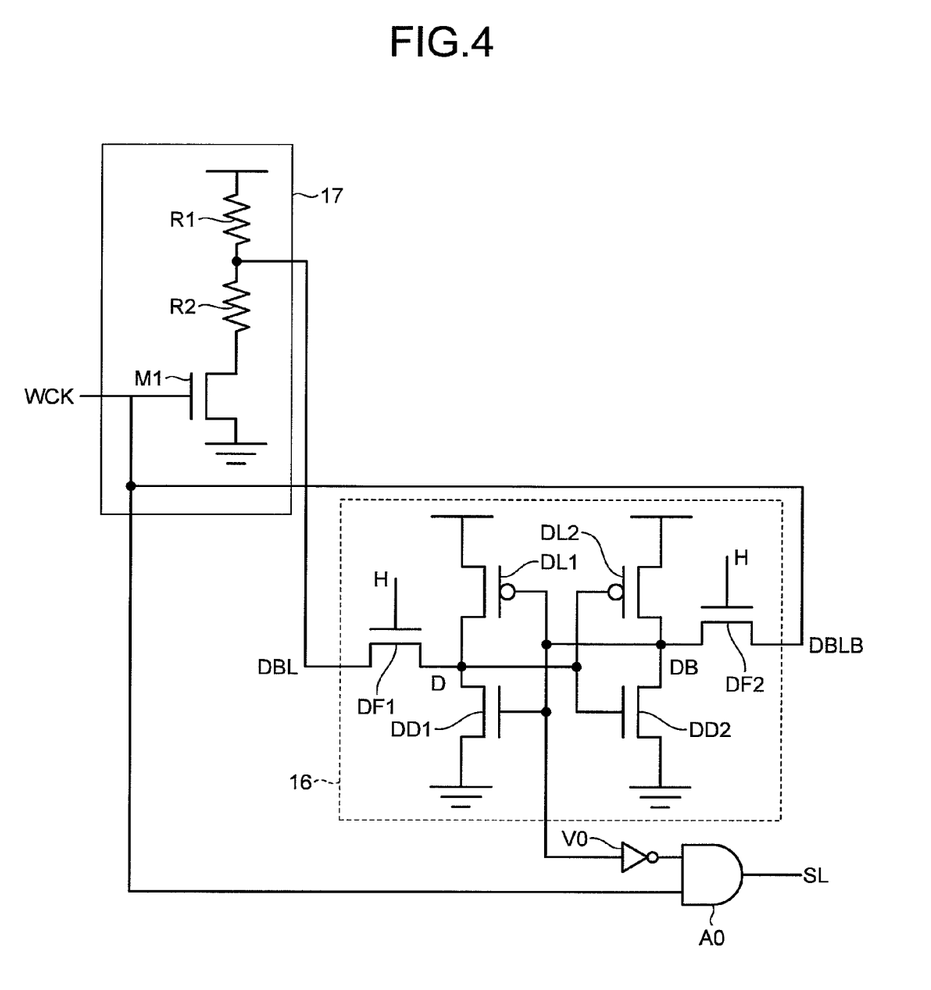
FIG. 4 is a circuit diagram illustrating a specific example of a dummy-bit-line voltage control unit applied to the semiconductor storage device in FIG. 1.

FIG. 4 is a circuit diagram illustrating a specific example of the dummy-bit-line voltage control unit 17 applied to the semiconductor storage device in FIG. 1.

In FIG. 4, the dummy-bit-line voltage control unit 17 in FIG. 1 includes a field-effect transistor M1 and resistors R1 and R2. The resistors R1 and R2 are connected in series with each other, the other end of the resistor R1 is connected to a high-level potential side, and the other end of the resistor R2 is connected to a low-level potential side via the field-effect transistor M1.

The connection point of the resistors R1 and R2 is connected to the dummy bit line DBL. Moreover, the word-line open allowing signal WCK is applied to the gate of the field-effect transistor M1 and the dummy bit line DBLB.

Then, when the word-line open allowing signal WCK becomes the high level H, the field-effect transistor M1 is turned on. Therefore, a voltage raised by a voltage drop by the resistor R2 from the low-level potential is applied to the dummy bit line DBL.

Therefore, at the time of writing to the memory cell 12, the time required for inverting data stored in the dummy node DB can be delayed, so that even when the time required for writing to the memory cell 12 and the dummy cell 16 varies, it is possible to prevent the word line WL from closing before completing writing to the memory cell 12.

On the other hand, when the word-line open allowing signal WCK becomes the low level L, the field-effect transistor M1 is turned off. Therefore, a voltage drop by the resistors R1 and R2 does not occur and a high-level potential is applied to the dummy bit line DBL.

Thus, at the time of rewiring to the dummy cell 16, it is possible to prevent increase in time required for returning data stored in the dummy node DB to the initial value.

Second Embodiment

Figure 5:
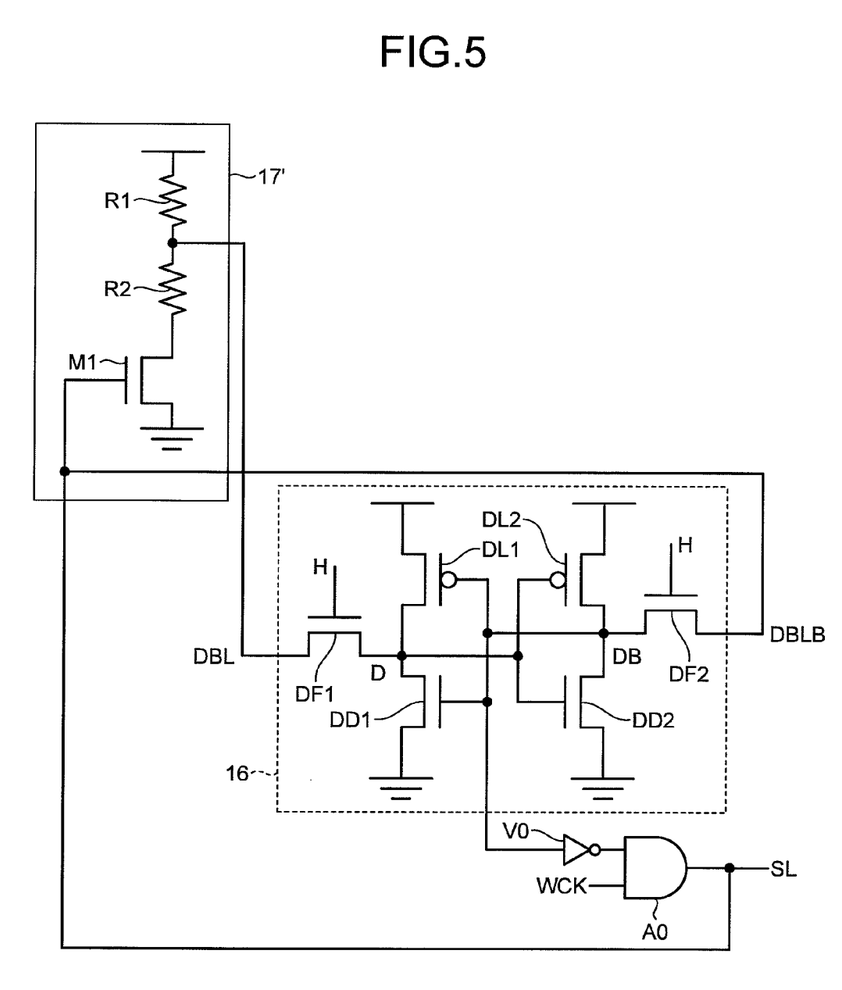
FIG. 5 is a circuit diagram illustrating a specific example of a dummy-bit-line voltage control unit applied to a semiconductor storage device according to a second embodiment.

FIG. 5 is a circuit diagram illustrating a specific example of a dummy-bit-line voltage control unit 17' applied to a semiconductor storage device according to the second embodiment.

In FIG. 5, this semiconductor storage device includes the dummy-bit-line voltage control unit 17' instead of the dummy-bit-line voltage control unit 17 in FIG. 4. In this dummy-bit-line voltage control unit 17', the gate of the field-effect transistor M1 is connected to the output terminal of the AND circuit A0 and the dummy bit line DBLB, whereby the word-line open signal SL is fed back to the dummy bit line DBLB.

Figure 6:
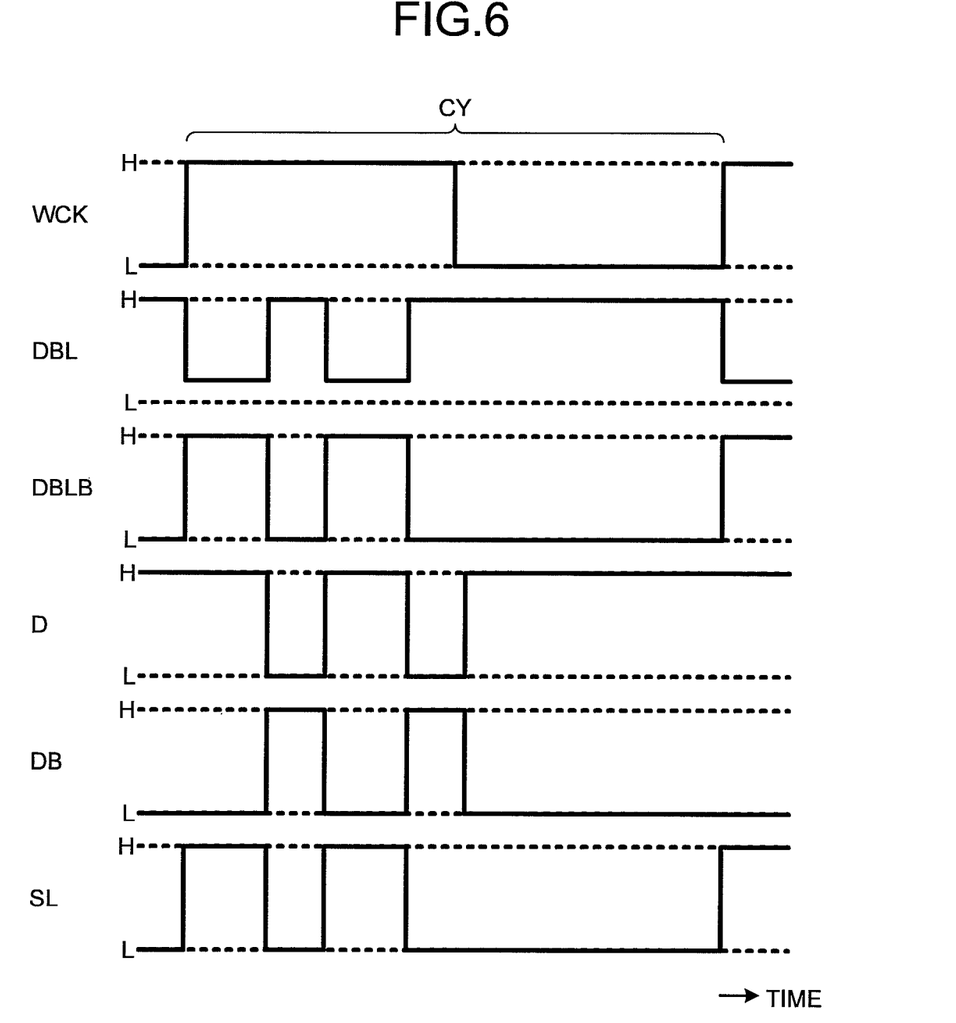
FIG. 6 is a timing chart illustrating a voltage waveform of each unit of the semiconductor storage device to which the dummy-bit-line voltage control unit in FIG. 5 is applied.

FIG. 6 is a timing chart illustrating a voltage waveform of each unit of the semiconductor storage device to which the dummy-bit-line voltage control unit 17' in FIG. 5 is applied.

In FIG. 6, when the word-line open allowing signal WCK is the high level H, the signal obtained by inverting the potential of the dummy node DB in the inverter V0 becomes the word-line open signal SL to be applied to the dummy bit line DBLB. Therefore, when the dummy node DB is the high level H, the low level L is written to the dummy node DB, and when the dummy node DB is the low level L, the high level H is written to the dummy node DB.

Therefore, when the word-line open allowing signal WCK is the high level H, the potential of the dummy node DB repeats the high level H and the low level L alternately. Consequently, it becomes possible to increase the total time in which the word-line open signal SL becomes the high level H when the word-line open allowing signal WCK is the high level H, so that even when the open time of the word line WL is controlled by referring to only a write margin, a read failure due to the read time shortage at the time of reading from the memory cell 12 can be reduced.

Moreover, the word-line open signal SL is controlled to repeat the high level H and the low level L alternately, so that the word line WL can be intermittently opened. Therefore, even when the word line WL is opened, the word line WL can be once closed before the potentials of the storage nodes N and NB of a non-selected cell are inverted, so that the word line WL can be opened again after returning the potentials of the storage nodes N and NB of the non-selected cell to the initial value. Consequently, even when the total time in which the word line WL becomes open is increased, increase in disturb failure can be suppressed.

Third Embodiment

Figure 7:
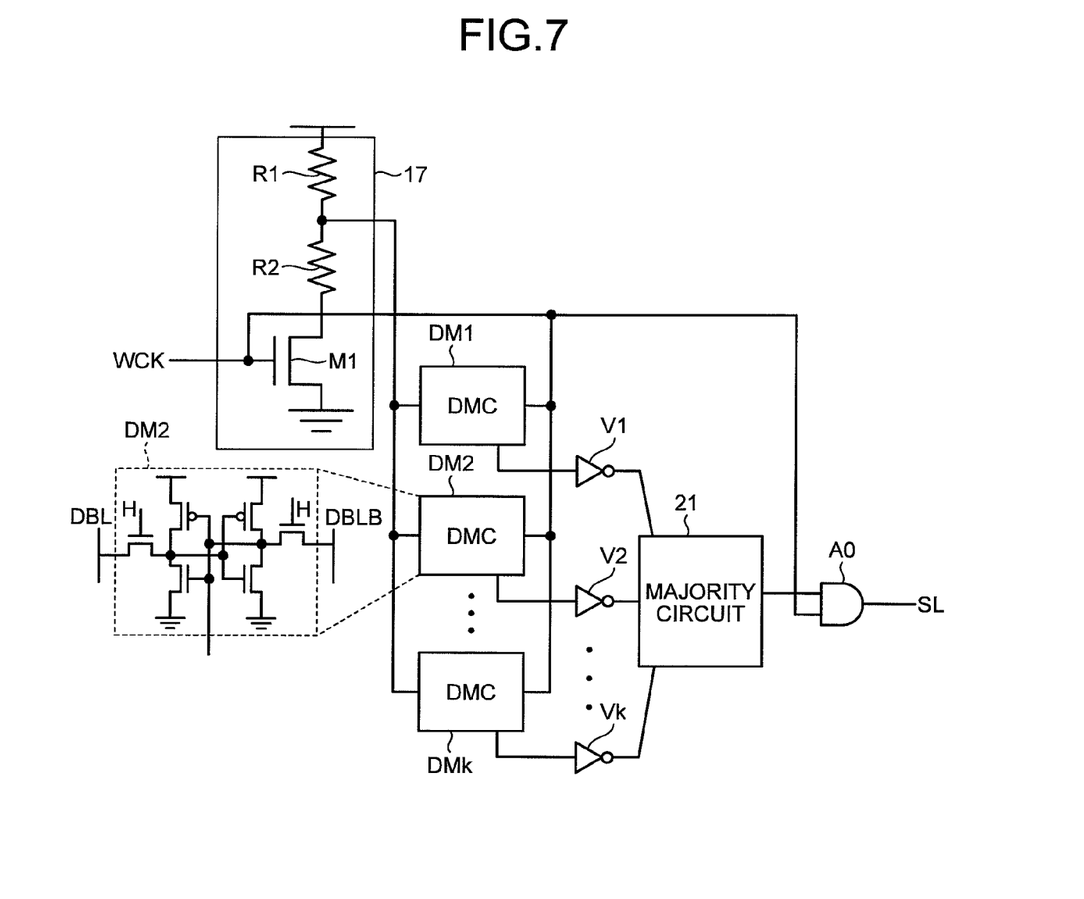
FIG. 7 is a block diagram illustrating a schematic configuration of a semiconductor storage device according to a third embodiment.

FIG. 7 is a block diagram illustrating a schematic configuration of a semiconductor storage device according to the third embodiment.

In FIG. 7, this semiconductor storage device includes a plurality of dummy cells DM1 to DMk (k is an integer of two or more) as the dummy cell 16 in FIG. 4. The dummy cells DM1 to DMk are connected in parallel with each other via the dummy bit lines DBL and DBLB.

Moreover, the dummy nodes DB of the dummy cells DM1 to DMk are connected to input terminals of a majority circuit 21 via the inverters V1 to Vk, respectively, and the output terminal of the majority circuit 21 is connected to one input terminal of the AND circuit A0. The majority circuit 21 can determine whether data stored in the dummy node DB is inverted in a predetermined number or more of the dummy cells DM1 to DMk.

Then, in the majority circuit 21, when it is determined that data stored in the dummy node DB is inverted in the predetermined number or more of the dummy cells DM1 to DMk, the output of the majority circuit 21 rises. Therefore, the word-line open signal SL becomes the low level L and the word line WL is closed, whereby writing to the memory cell 12 is stopped.

The word line WL is controlled to close based on the inversion condition of the dummy cells DM1 to DMk, so that variation in time required for writing to the dummy cells DM1 to DMk can be absorbed.

Fourth Embodiment

Figure 8:
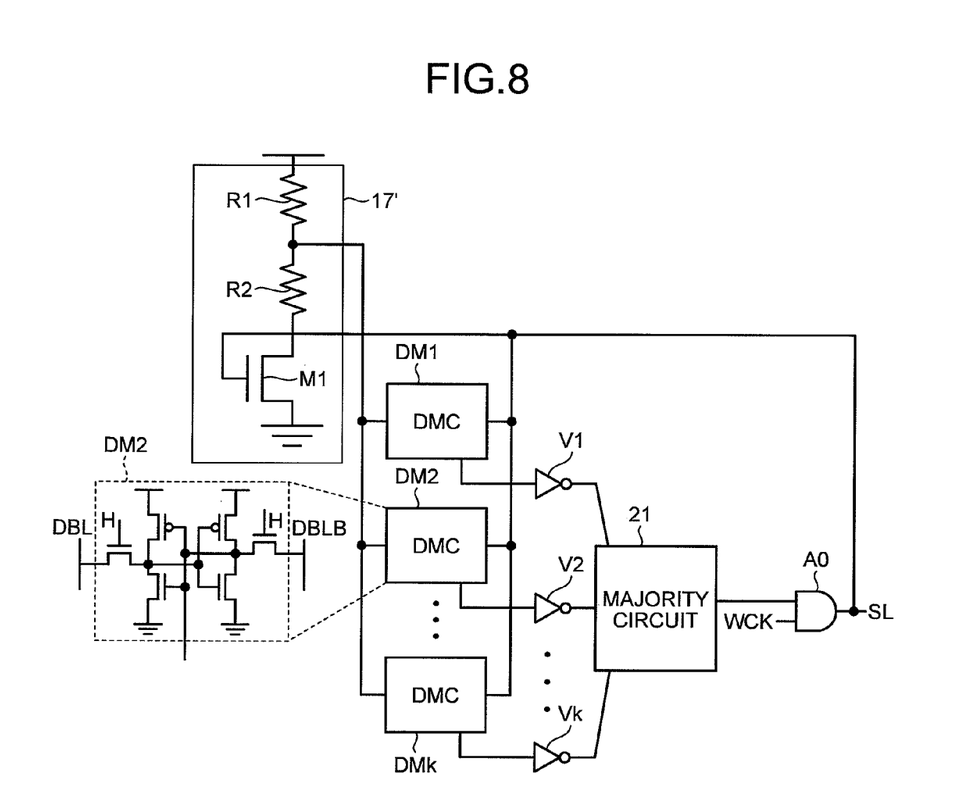
FIG. 8 is a block diagram illustrating a schematic configuration of a semiconductor storage device according to a fourth embodiment.

FIG. 8 is a block diagram illustrating a schematic configuration of a semiconductor storage device according to the fourth embodiment.

In FIG. 8, this semiconductor storage device is similar to that in FIG. 7 except that the dummy-bit-line voltage control unit 17' in FIG. 5 is provided instead of the dummy-bit-line voltage control unit 17 in FIG. 7.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device comprising:
   a word line communicating with a memory cell, the memory cell comprising a first storage node and a second storage node that are configured to complementarily store data;
   a first bit line and a second bit line, wherein the first bit line is configured to transmit data to or from the first storage node and the second bit line is configured to transmit data to or from the second storage node;
   a dummy cell comprising a first dummy node and a second dummy node that are configured to complementarily store data;
   a first dummy bit line and a second dummy bit line, wherein the first dummy bit line is configured to transmit data to or from the first dummy cell and the second bit line is configured to transmit data to or from the second dummy node;
   a dummy-bit-line voltage control unit configured to control a voltage of one or both of the dummy bit lines and thereby invert data stored in one of the dummy nodes;
   a selection-time control unit configured to control a time for selecting the word line based on an inversion condition of the data stored in the dummy node that is subject to the data inversion; and
   a row decoder configured to select the word line based on selection time controlled by the selection-time control unit.

2. The semiconductor storage device according to claim 1, wherein the dummy-bit-line voltage control unit is configured to control the voltage(s) based on instructions for opening and closing the word line.

3. The semiconductor storage device according to claim 1, wherein the dummy-bit-line voltage control unit is configured to control the voltage of one or both of the dummy bit lines and thereby return the data stored in the dummy node that is subject to the data inversion to an initial value after inverting the data stored in the dummy node in each write cycle.

4. The semiconductor storage device according to claim 1, wherein the dummy-bit-line voltage control unit is configured to control the voltage of one or both of the dummy bit lines so that the data stored in the dummy node that is subject to the data inversion is inverted repeatedly a plurality of times in each read cycle or each write cycle.

5. The semiconductor storage device according to claim 4, wherein the dummy-bit-line voltage control unit is configured to control the voltage of one or both of the dummy bit lines based on the row selection time controlled by the selection-time control unit.

6. The semiconductor storage device according to claim 1, wherein the dummy-bit-line voltage control unit is configured to raise the voltage of the dummy bit line corresponding to a low side of the dummy cell above the voltage of the bit line corresponding to a low side of the memory cell so that inversion of the data stored in the dummy node that is subject to inversion is delayed by a predetermined value.

7. The semiconductor storage device according to claim 6, wherein the dummy-bit-line voltage control unit is configured to raise the voltage of the dummy bit line corresponding to the low side of the dummy cell by resistance voltage division.

8. The semiconductor storage device according to claim 1, wherein the selection-time control unit is configured to instruct the row decoder to close the word line when the data stored in the dummy node subject to inversion is inverted in a state where closing of the word line is instructed.

9. The semiconductor storage device according to claim 8, wherein the selection-time control unit is configured to generate a word-line open signal that causes the word line to open and close based on a logical product of the data stored in the dummy node subject to inversion and a signal that instructs opening and closing of the word line.

10. The semiconductor storage device according to claim 9, wherein the row decoder is configured to select the word line based on a logical product of the word-line open signal and a word-line selection signal.

11. The semiconductor storage device according to claim 1, wherein
   the semiconductor storage device comprises a plurality of dummy cells,
   the semiconductor storage device further comprises a circuit configured to determine whether the data stored in the dummy node subject to inversion is inverted in at least a predetermined number of the dummy cells, and
   the selection-time control unit is configured to control the word line selection time of the memory cell based on a determination result by the circuit.

12. The semiconductor storage device according to claim 1, wherein
   the memory cell comprises a pair of first drive transistors, a pair of first load transistors, and a pair of first transfer transistors,
   the dummy cell comprises a pair of second drive transistors, a pair of second load transistors, and a pair of second transfer transistors,
   gates of the first transfer transistors are connected to the word line, and
   gates of the second transfer transistors are configured to receive a high-level potential.

13. A semiconductor storage device comprising:
   a word line communicating with a memory cell configured to store data;
   a dummy cell configured to replicate an operation of the memory cell;
   a write control unit configured to cause the dummy cell to perform writing in synchronization with write timing of the memory cell; and
   a row decoder configured to perform opening and closing of the word line and select the memory cell based on a monitored result of a write condition of the dummy cell,
   wherein the write control unit is configured to invert data stored in the dummy cell every time opening and closing of the word line is instructed, and
   wherein the write control unit is configured to return the data stored in the dummy cell to an initial value after inverting the data stored in the dummy cell in each write cycle.

14. The semiconductor storage device according to claim 13, wherein the row decoder is configured to close the word line when the data stored in the dummy cell is inverted in a state where closing of the word line is instructed.

15. The semiconductor storage device according to claim 13, wherein
the write control unit is configured to invert the data stored in the dummy cell based on a signal that instructs opening and closing of the word line, and
the row decoder is configured to perform opening and closing of the word line based on a logical product of the data stored in the dummy cell and the signal.

16. A semiconductor storage device comprising:
a word line communicating with a memory cell configured to store data;
a dummy cell configured to replicate an operation of the memory cell;
a write control unit configured to cause the dummy cell to perform writing in synchronization with write timing of the memory cell; and
a row decoder configured to perform opening and closing of the word line and select the memory cell based on a monitored result of a write condition of the dummy cell,
wherein the write control unit is configured to invert data stored in the dummy cell every time opening and closing of the word line is instructed, and
wherein the write control unit is configured to invert the data stored in the dummy cell a plurality of times in each read cycle or each write cycle.

17. A semiconductor storage device comprising:
a word line communicating with a memory cell configured to store data;
a dummy cell configured to replicate an operation of the memory cell;
a write control unit configured to cause the dummy cell to perform writing in synchronization with write timing of the memory cell; and
a row decoder configured to perform opening and closing of the word line and select the memory cell based on a monitored result of a write condition of the dummy cell,
wherein the write control unit is configured to invert data stored in the dummy cell every time opening and closing of the word line is instructed, and
wherein the write control unit is configured to control a write voltage of the dummy cell so that inversion of the data stored in the dummy cell is delayed by a predetermined value.

18. A semiconductor storage device comprising:
a word line communicating with a memory cell configured to store data;
a dummy cell configured to replicate an operation of the memory cell;
a write control unit configured to cause the dummy cell to perform writing in synchronization with write timing of the memory cell; and
a row decoder configured to perform opening and closing of the word line and select the memory cell based on a monitored result of a write condition of the dummy cell,
wherein
the memory cell comprises a pair of first drive transistors, a pair of first load transistors, and a pair of first transfer transistors,
the dummy cell comprises a pair of second drive transistors, a pair of second load transistors, and a pair of second transfer transistors,
gates of the first transfer transistors are connected to the word line, and
gates of the second transfer transistors are configured to receive a high-level potential.

* * * * *